United States Patent
Kung et al.

(10) Patent No.: US 6,277,669 B1
(45) Date of Patent: Aug. 21, 2001

(54) WAFER LEVEL PACKAGING METHOD AND PACKAGES FORMED

(75) Inventors: Ling-Chen Kung, Hsinchu; Jyh-Rong Lin, Taipei; Kuo-Chuan Chen, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/396,060

(22) Filed: Sep. 15, 1999

(51) Int. Cl.[7] .......................... H01L 21/44; H01L 21/48; H01L 21/50

(52) U.S. Cl. .......................... 438/106; 438/108; 438/612

(58) Field of Search .................................... 438/106, 108, 438/612

(56) References Cited

U.S. PATENT DOCUMENTS 6,163,463 * 12/2000 Marrs .
6,187,615 * 2/2001 Kim et al. .
6,187,680 * 2/2001 Costrini et al. .
6,197,613 * 3/2001 Kung et al. .

* cited by examiner

Primary Examiner—John F. Niebling
Assistant Examiner—Josetta Jones
(74) Attorney, Agent, or Firm—Tung & Associates

(57) ABSTRACT

A method for fabricating a wafer level package and packages formed are disclosed. In the method, an elastomeric material layer is first deposited on top of a passivation layer by a printing, coating or laminating method to form a plurality of isolated islands. The islands may have a thickness of less than 100 $\mu$m. Metal traces for I/O redistribution are then formed to connect the isolated islands with bond pads provided on the surface of the wafer such that one bond pad is connected electrically to one isolated island. On top of the metal trace is then deposited an organic material for insulation with the metal trace on top of the isolated islands exposed. After an UBM layer is formed on top of the metal traces that are exposed on the isolated islands, solder balls of suitable size may be planted by a plating technique, a printing technique or a pick and place technique to complete the wafer level package.

22 Claims, 6 Drawing Sheets

(A)

(B)

(C)

(D)

(E)

(F)

(A)

(B)

(C)

(D)

( E )

( F )

( G )

WAFER LEVEL PACKAGING METHOD AND PACKAGES FORMED

FIELD OF THE INVENTION

The present invention generally relates to a method for forming a wafer level package and packages formed and more particularly, relates to a method for forming a wafer level package wherein a plurality of isolated islands is first formed of an elastomeric material on top of the wafer followed by the planting of a plurality of solder balls on top of the islands such that the balls are stress buffered by the elastomeric material and packages formed by the method.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modem high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UMB layer 26 improves bonding between a solder ball to be formed and the top surface 18 of the bond pad 14.

In the next step of the process, as shown in FIG. 1C, a photoresist layer 34 is deposited on top of the UMB layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e., such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 μm, is formed of a polymeric material such as polyimide which is laminated to a silicon elastomer layer of approximately 150 μm thick. The silicon elastomeric layer provides flexibility and compliance in all three directions for relief of stresses and thermal expansion mismatches.

To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

In a co-pending application assigned to the common assignee of the present application Ser. No. 09/274,611, filed Mar. 23, 1999, which is incorporated in its entirety herewith by reference, a method for forming a wafer level package that contains a multiplicity of IC dies each having an I/O redistribution is disclosed. In the method, as depicted in FIG. 2, a wafer level package 44 is formed by first providing a silicon wafer (not shown) which has a multiplicity of IC dies 46 formed on a top surface. Each of the multiplicity of IC dies 46 has at least one first I/O pad 48 formed in a first insulating layer 50. At least one via plug 52 is then formed of a first conductive metal material on top of the at least one first I/O pad 48. A layer of second insulating material 54 that has sufficient elasticity is then coated on the top surface of the IC die 46 leaving a top surface of the at least one via plug 52 substantially exposed from the insulating material layer 54. A second conductive metal layer 56 is then deposited on top of the second insulating material layer 54 to form at least one metal trace 58 with a first end electrically connecting the at least one via plug 52 and a second end extending away from the first end. A third insulating material layer 60 is then deposited on top of the at least one metal trace 58 and is defined to expose at least one second I/O pad at the second end of the at least one metal trace 58. Depositing a UBM (under-bump-metallurgy) layer 62 and forming at least one solder ball 66 on a top surface 64 of the UBM layer 62.

The method shown in FIG. 2, while providing an adequate stress buffer layer 54 for the solder balls 66, requires process of coating the entire surface of the IC die 46 with an elastomeric material layer, which is time-consuming and costly. A simplified method that is capable of achieving the same desirable stress buffering effect is therefore needed for providing wafer level packages at low cost.

It is therefore an object of the present invention to provide a wafer level packaging method and packages formed by the method that can be carried out without the drawbacks and shortcomings of the conventional methods.

It is another object of the present invention to provide a method for fabricating a wafer level package that does not require the coating of an elastomeric material over he entire surface of the wafer.

It is a further object of the present invention to provide a method for fabricating a wafer level package that can be severed into IC dies after solder balls are first planted on the wafer level package.

It is another further object of the present invention to provide a method for fabricating a wafer level package that can be carried out by printing an elastomeric material layer on top of the wafer forming a plurality of isolated islands as bonding sites for subsequently planted solder balls.

It is still another object of the present invention to provide a method for fabricating a wafer level package by first forming isolated islands of an elastomeric material on top of the wafer and then forming I/O redistribution metal traces connecting the islands with bond pads.

It is yet another object of the present invention to provide a method for fabricating a wafer level package by utilizing a stress buffering layer of elastomeric material under the solder balls that has a Young's modules not higher than 6 MPa/cm$^2$ and a thickness not more than 100 μm.

It is still another further object of the present invention to provide a wafer level package that contains a plurality of isolated islands formed on top of the wafer of an elastomeric material such that when solder balls are subsequently planted on top of the islands, a desirable stress buffering effect is achieved.

It is yet another further object of the present invention to provide a wafer level package that is formed with a passivation layer, an elastomeric layer, an I/O redistribution metal layer, an organic material layer, an UBM layer and solder balls planted on top of the UBM layer.

SUMMARY OF THE INVENTION

In accordance with the present invention, a method for fabricating a wafer level package and a package formed by such method are provided.

In the preferred embodiment, a method for fabricating a wafer level package can be carried out by the steps of providing a pre-processed wafer that has at least two bond pads on top, depositing a passivation layer on top of the pre-processed wafer exposing the at least two bond pads, printing an elastomeric material layer on top of the passivation layer forming a plurality of isolated islands, forming I/O redistribution metal traces between the at least two bond pads and the plurality of isolated islands, respectively such that one of the at least two bond pads is electrically connected to one of the plurality of isolated islands, forming an organic material on top of the wafer exposing the metal traces formed on top of the plurality of isolated islands, forming an under-bump-metallurgy (UBM) layer on top of the exposed metal traces on the plurality of isolated islands, and planting a plurality of solder balls on top of the UBM layers such that the solder balls are stress buffered by the plurality of isolated islands.

The method for fabricating a wafer level package may further include the step of depositing a passivation layer of silicon oxide or silicon nitride, the step of printing an elastomeric material layer of a material that has sufficient stress buffering characteristic, and the step of printing an elastomeric layer of a material that has a Young's modules not higher than 6 MPa/cm². The method may further include the step of forming the plurality of isolated islands to a thickness of not more than 100 µm, or to a thickness of preferably not more than 50 µm.

The method for fabricating a wafer level package may further include the steps of depositing a passivation layer of silicon oxide or silicon nitride, depositing a photoresist layer on top of the passivation layer, patterning the photoresist layer, and developing the photoresist layer to expose the at least two bond pads. The method may further include the step of printing the elastomeric material layer by a stencil printing or a screen printing technique. The method may further include the step of forming the I/O redistribution metal traces by a sputtering technique, or by an eletroplating technique. The method may further include the step of forming I/O redistribution metal traces in Al, Cu, Al alloys or Cy alloys.

The method for forming a wafer level package may further be carried out by the additional processing steps of depositing a metal layer of Al, Cu, Al alloys or Cu alloys, depositing a photoresist layer on top of the metal layer, patterning the photoresist layer for the I/O redistribution metal traces, and etching the I/O redistribution metal traces and electrically connecting the at least two bond pads with the plurality of isolated islands. The organic material may be formed of a photosensitive material such that the layer can be patterned to expose the metal traces on top of the plurality of isolated islands. The method may further include the step of forming the UBM layer by a method of electroless plating, electroplating or sputtering. The method may further include the steps of forming the UBM layer on top of the wafer, forming a photoresist layer on the UBM layer, and patterning the photoresist layer such that the UBM layer only covers the plurality of isolated islands. The method may further include the step of planting the plurality of solder balls by a technique of plating, printing or pick and place.

The present invention is further directed to a wafer level package that includes a pre-processed wafer that has at least two bond pads on top, a passivation layer on top of the wafer exposing the at least two bond pads, a plurality of isolated islands formed of an elastomeric material on top of the passivation layer, at least two I/O redistribution metal traces each electrically connecting one of the at least two bond pads to one of the plurality of isolated islands, an organic material layer covering and electrically insulating the wafer except the metal traces on top of the plurality of isolated islands, an UBM layer on top of the metal traces on the plurality of isolated islands, and a plurality of solder balls each on top of one of the plurality of isolated islands with the metal traces and the UBM layer thereinbetween.

In the wafer level package, the passivation layer may be formed of silicon oxide or silicon nitride. The plurality of isolated islands may be formed of an elastomeric material that has a Young's modules of not more than 6 MPa/cm². The plurality of isolated islands may be formed to a thickness of not more than 50 µm. The I/O redistribution metal traces may be formed of Al, Cu, Al alloys or Cu alloys. The organic material layer may be formed of a photosensitive material for patterning and for forming in a photolithographic process.

BRIEF DESCRIPTION OF THE DRAWINGS

These objects, features and advantages will become apparent from a close examination of the following specification and the appended drawings in which.

DETAILED DESCRIPTION OF THE PREFERRED EMBODIMENT

The present invention discloses a method for fabricating a wafer level package and a package formed by the method.

In the method, a plurality of isolated islands are stencil printed of an elastomeric material on top of a passivation layer on an IC die for providing a desirable stress buffering effect to the solder balls that are subsequently planted on top. The stencil printing process of the elastomeric material layer can be easily carried out at low costs without requiring the costly process of photolithography. After a plurality of isolated islands are first formed by an elastomeric material that has a low Young's modules, i.e., less than 6 $MPa/cm^2$, a series of I/O redistribution metal traces are deposited and formed on top of the IC die to connect between bond pads and isolated islands. After an organic material layer that is photosensitive is deposited on top of the IC die and patterned to expose the metal traces on top of the isolated islands and UBM layers are deposited on top of the exposed metal traces, solder balls may be planted on top of the UBM layers by a technique of plating, printing or pick and place.

The present invention further provides a wafer level package that has solder balls formed on the wafer surface with desirable stress buffered properties since the balls are planted on top of isolated islands formed of a stress buffering material, such as an elastomer of low Young's modules. The present invention novel method allows an entire wafer to be planted with solder balls before individual IC dies are severed and scribed into IC chips for further packaging. The present invention novel method therefore provides a low cost packaging method for the entire wafer (i.e., at a wafer level) which can be carried out at a substantially lower cost basis than forming solder balls on each individual IC dies that have been severed from a wafer.

Figure 3:
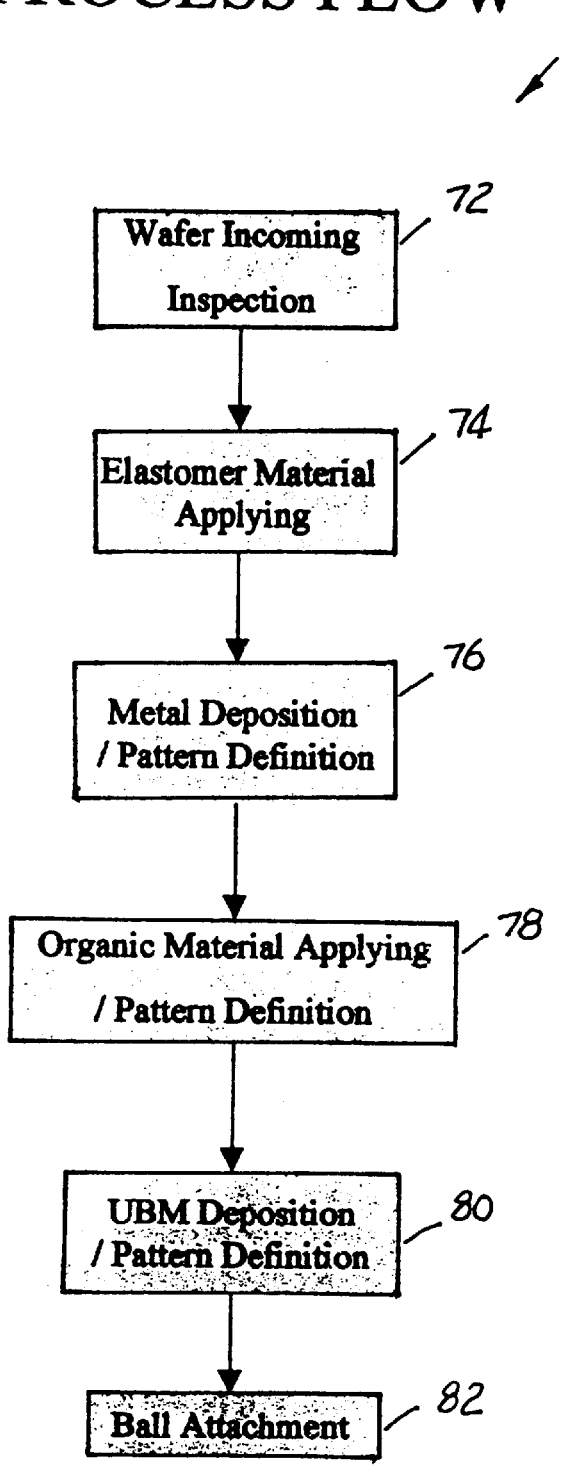
FIG. 3 is a process flow chart for the present invention method of forming elastomeric isolated islands and solder balls planted on the islands for achieving stress buffering effect.

Referring now to FIG. 3, wherein a process flow chart 70 for the present invention novel method is shown. In the first step 72, an incoming, pre-processed wafer is first inspected visually to insure there are no visible defects on the wafer. An elastomeric material is then applied to the surface of the wafer in step 74 by a stencil printing or a screen printing technique. The elastomeric material is printed to form a plurality of isolated islands having a thickness of not more than 100 $\mu$m and preferably a thickness not more than 50 $\mu$m. In the next step 76 of the process, a thin metal layer is deposited and formed into I/O redistribution metal traces by a deposition method followed by a photolithographic method. Metal traces connecting between bond pads and the isolated islands formed of elastomer are thus formed. On top of the metal trace, is then deposited an organic material which is insulative. This is step 78. The organic material is preferably photosensitive such that it can be patterned and defined to expose the top portions of the isolated islands and to expose the metal traces on the islands. An under-bump-metallurgy layer is then deposited on top of the metal traces on the isolated islands and defined in step 80. In the final step 82, solder balls are planted on top of the UBM layers to complete the wafer packaging process.

Detail processing steps for the present invention wafer level package can be shown in FIGS. 4A–4G. FIG. 4A illustrates an IC die 84 which is part of a wafer (not shown) having at least two bond pads 86 formed on a top surface 88 of the IC die 84. This is shown in FIG. 4A. In the next step of the process, as shown in FIG. 4B, a passivation layer, or a dielectric material layer 90 is deposited on top and then patterned and formed to expose the bond pads 86. The bond pads 86 are normally formed of a conductive metal such as aluminum, copper or their alloys. The dielectric layer 90 may be patterned and defined by a photoresist layer to expose the top surface of the bond pad 86. On top of the dielectric material layer 90 is thus printed, by either a stencil printing or a screen printing method, an elastomeric material layer in the shape of isolated islands. It is preferred that the elastomeric material used to form the isolated islands 92 be a silicon rubber or a fluorosilicone rubber. The elastomeric material preferably should have a low Young's modules that is not larger than 20 $MPa/cm^2$, and preferably not larger than 10 $MPa/cm^2$, and more preferably not larger than 6 $MPa/cm^2$. The thickness of the isolated islands 92 should be less than 100 $\mu$m, and preferably less than 50 $\mu$m. This is shown in FIG. 4C. It is to be noted that the cross-sectional shape of the isolated islands 92 can be of any suitable shape, including but not limited to rectangular, half circular and half oval.

FIG. 4D shows the next step of the present invention novel process wherein a thin metal layer is deposited to form I/O redistribution metal traces 94. The metal traces layer 94 can be deposited by any suitable deposition means such as sputtering, electroless plating or electroplating. The thin metal layer may first be deposited followed by a deposition of a photoresist layer on top. A photolithographic method is then used to define and form the metal traces 94 such that the bond pads 86 are connected to the isolated islands in such a way that one bond pad is connected to one isolated island, as shown in FIG. 4D. The metal deposited for forming metal traces can be aluminum, copper or an UBM material. The metal traces 94 can further be formed by a method utilizing first, a photoresist layer for defining the metal trace pattern and then filling the cavities by an electroless or electroplating method utilizing aluminum or copper.

In the next step of the process, as shown in FIG. 4E, an organic material layer 96, preferably of a photosensitive nature, is deposited on top of the wafer and then patterned and formed by a photolithographic method to expose the metal traces 94 on the isolated islands 92. The organic material layer 96 can be suitably formed of a polyimide material, a BCB material or any other organic materials which can be applied by a spin coating process, a printing process or a laminating process. When the material utilized is photosensitive, there is no need for applying another layer of photoresist material on top for conducting the photolithographic method.

FIG. 4F illustrates the next step of the present invention novel method in depositing an UBM layer by an electroless plating method, an electroplating method or a sputtering method. The UBM metal layer is then defined and patterned by a photolithographic method such that only an UBM cap 98 remains on top of the metal trace layer 94 and the isolated island 92.

In the last step of the present invention novel process, as shown in FIG. 4G, solder balls 100 are planted on top of the UBM layer 98, the metal trace 94 and the isolated island 92. The solder balls 100 can be planted by a plating method, a printing method or a pick and place method. The diameter of the solder balls planted is at least 50 µm.

Figure 1:
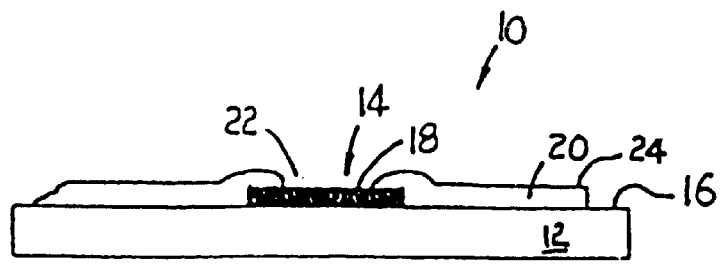
FIG. 1A is an enlarged, cross-sectional view of a conventional pre-processed semiconductor substrate which has a bond pad and a passivation layer formed on top.
FIG. 1B is an enlarged, cross-sectional view of the conventional semiconductor structure of FIG. 1A which has an under-bump-metallurgy (UBM) layer formed on top.
FIG. 1C is an enlarged, cross-sectional view of the conventional semiconductor structure of FIG. 1B with a photoresist layer deposited and defined on top.
FIG. 1D is an enlarged, cross-sectional view of the conventional semiconductor structure of FIG. 1C with a solder material deposited in the window openings for the solder bump.
FIG. 1E is an enlarged, cross-sectional view of the conventional semiconductor structure of FIG. 1D with the photoresist layer removed in a wet etching process.
FIG. 1F is an enlarged, cross-sectional view of the conventional semiconductor structure of FIG. 1E with the exposed UBM layer removed and the solder bump reflowed into a solder ball.
Figure 1:
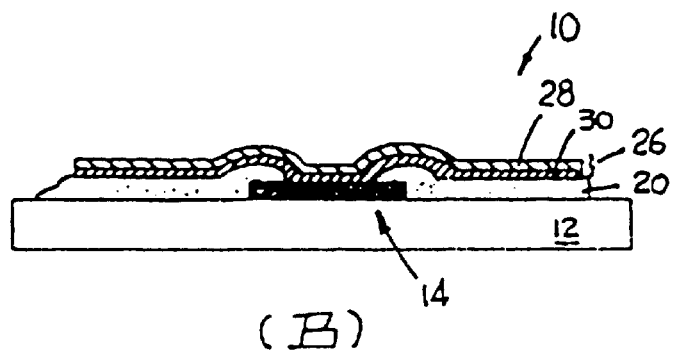
Figure 1:
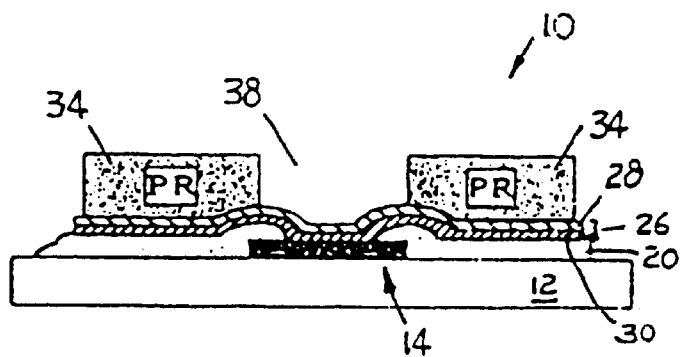
Figure 1:
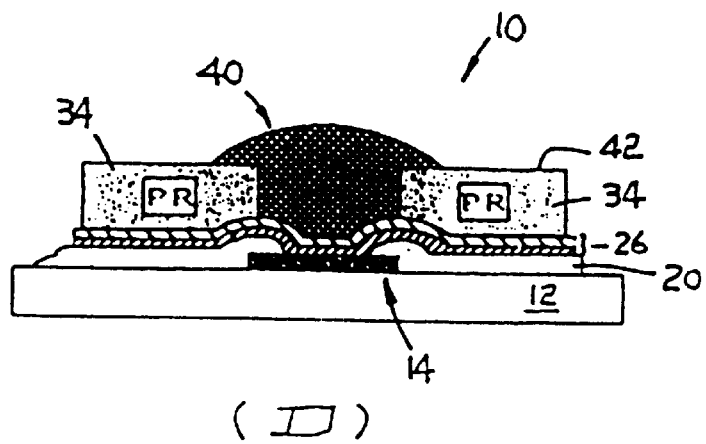
Figure 1:
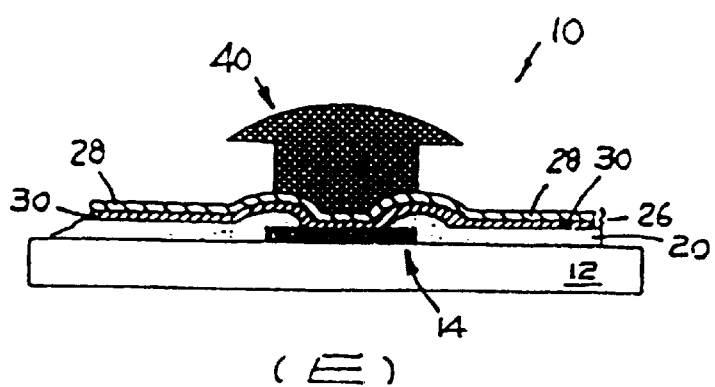
Figure 1:
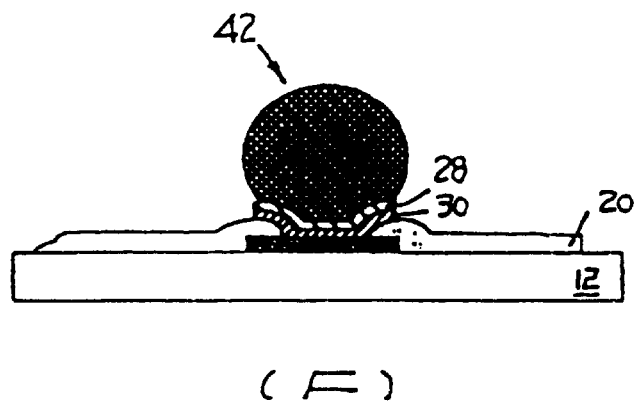
Figure 2:
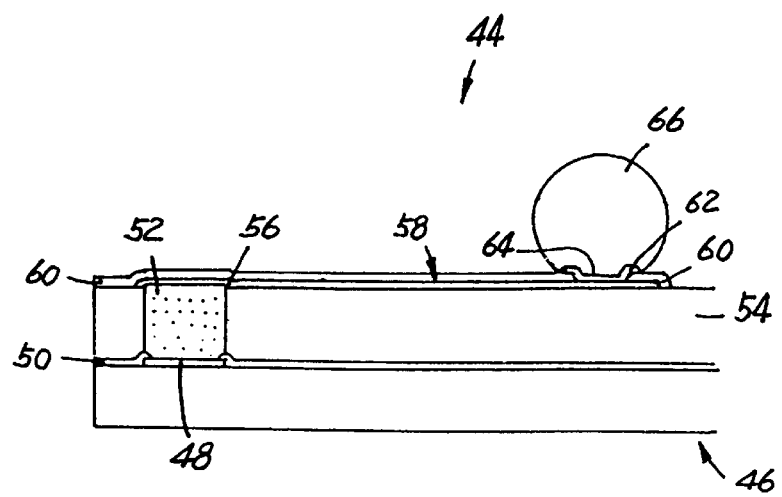
FIG. 2 is an enlarged, cross-sectional view of a wafer level package that utilizes an elastomeric material layer deposited over the entire wafer surface.
Figure 5:
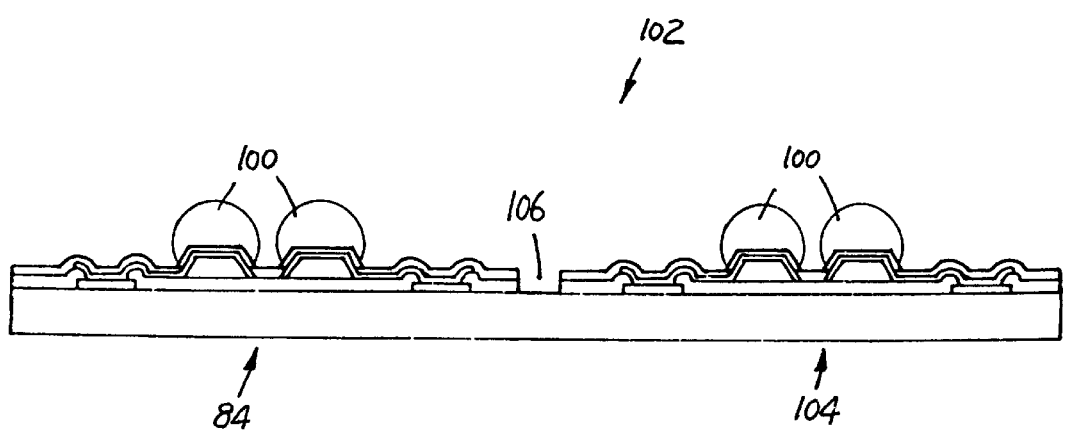
FIG. 5 is an enlarged, cross-sectional view of the present invention wafer level package showing two IC dies separated by a scribe line thereinbetween.
Figure 4:
FIG. 4A is an enlarged, cross-sectional view of a present invention IC die as part of a wafer that has at least two bond pads formed on a top surface.
FIG. 4B is an enlarged, cross-sectional view of the present invention IC die of FIG. 4A having an additional passivation layer formed on top exposing the bond pads.
FIG. 4C is an enlarged, cross-sectional view of the present invention IC die of FIG. 4B having a plurality of isolated islands printed of an elastomeric material on top of the passivation layer.
FIG. 4D is an enlarged, cross-sectional view of the present invention IC die of FIG. 4C with an I/O redistribution metal trace layer deposited and formed on top of the IC die electrically connecting the bond pad to the isolated island.
FIG. 4E is an enlarged, cross-sectional view of the present invention IC die of FIG. 4D having an organic material layer deposited on top for insulating the IC die except the top of the isolated islands.
FIG. 4F is an enlarged, cross-sectional view of the present invention IC die of FIG. 4E having UBM layers deposited and patterned on top of the isolated islands.
FIG. 4G is an enlarged, cross-sectional view of the present invention IC die of FIG. 4F having solder balls planted on top of the UBM layers and the isolated islands.
Figure 4:
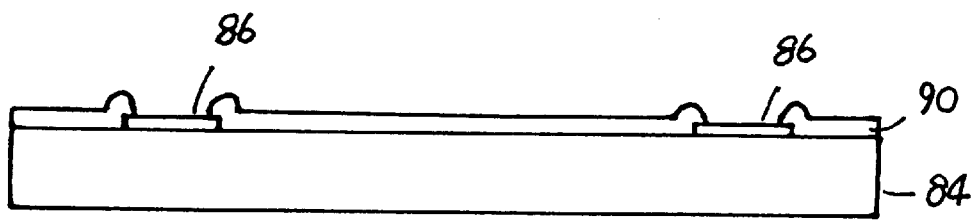
Figure 4:
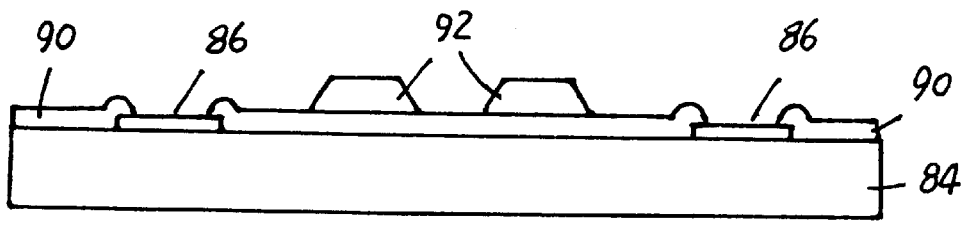
Figure 4:
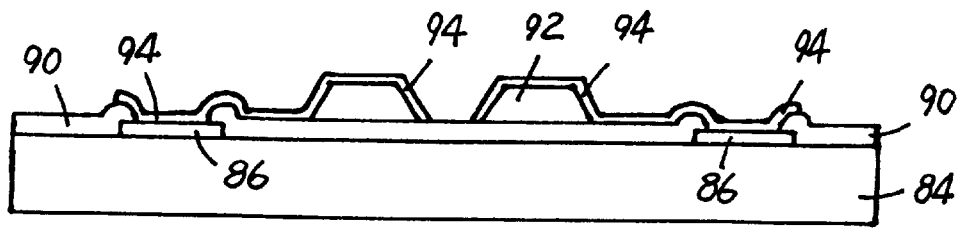
Figure 4:
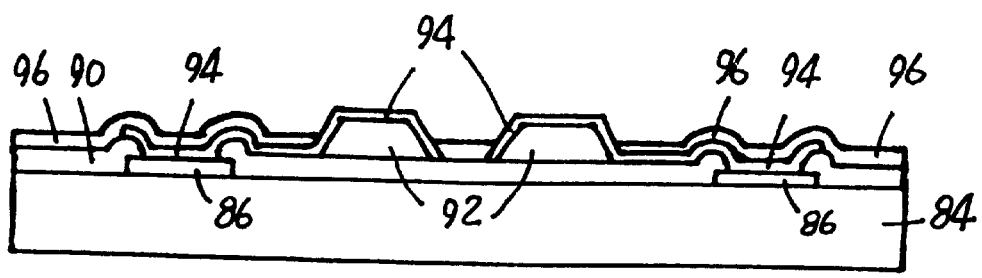
Figure 4:
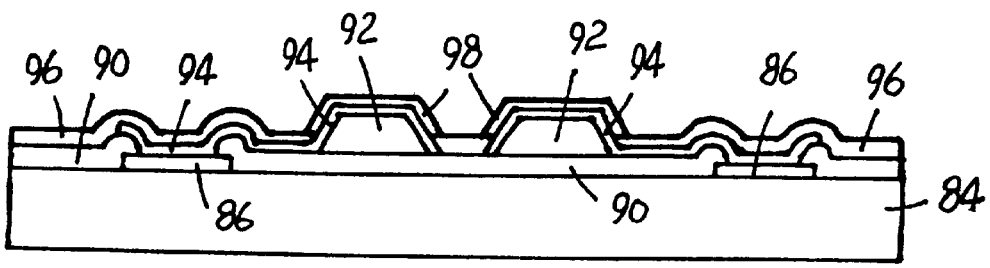
Figure 4:
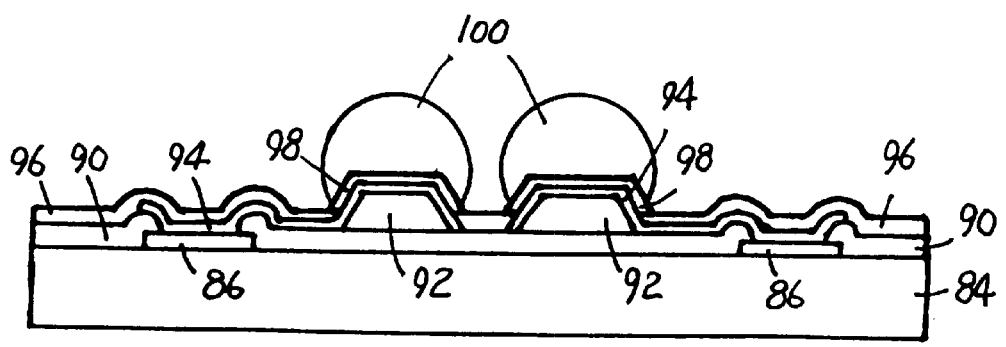

The present invention novel method for fabricating a wafer level package and a package thus formed have therefore been amply described in the above descriptions and in the appended drawings of FIGS. 3–4G. The wafer level package 102 is further shown in FIG. 5 wherein two IC dies 84 and 104 are shown. The two IC dies 84, 104 are divided by a scribe line 106 which is used to scribe and severe the two IC dies apart after the wafer level package is completed, i.e., after the solder balls 100 are planted. It is to be noted that two IC dies 84, 104 are used for illustrating a wafer only, and in reality, hundreds of dies are included on top of a wafer of eight inch or larger diameter.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for fabricating a wafer level package comprising the steps of:
   providing a pre-processed wafer having at least two bond pads on top,
   depositing a passivation layer on top of said pre-processed wafer exposing said at least two bond pads,
   printing an elastomeric material layer on top of said passivation layer forming a plurality of isolated islands,
   forming I/O redistribution metal traces between said at least two bond pads and said plurality of isolated islands, respectively such that one of said at least two bond pads being electrically connected to one of said plurality of isolated islands,
   forming an organic material layer on top of said wafer exposing said metal traces formed on top of said plurality of isolated islands,
   forming an under-bump-metallurgy (UBM) layer on top of said exposed metal traces and said plurality of isolated islands, and
   planting a plurality of solder balls on top of said UBM layers such that said solder balls are stress buffered by said plurality of isolated islands.

2. A method for fabricating a wafer level package according to claim 1 further comprising the step of depositing a passivation layer of silicon oxide or silicon nitride.

3. A method for fabricating a wafer level package according to claim 1 further comprising the step of printing an elastomeric layer of a material having sufficient stress buffering characteristic.

4. A method for fabricating a wafer level package according to claim 1 further comprising the step of printing an elastomeric layer of a material having a Young's modules not higher than 10 MPa/cm$^2$.

5. A method for fabricating a wafer level package according to claim 1 further comprising the step of forming said plurality of isolated islands to a thickness of not more than 100 µm.

6. A method for fabricating a wafer level package according to claim 1 further comprising the step of forming said plurality of isolated islands to a thickness of preferably not more than 50 µm.

7. A method for fabricating a wafer level package according to claim 1 further comprising the steps of:
   depositing a passivation layer of silicon oxide or silicon nitride on said wafer,
   depositing a photoresist layer on top of said passivation layer,
   patterning said photoresist layer, and
   developing said photoresist layer to expose said at least two bond pads.

8. A method for fabricating a wafer level package according to claim 1 further comprising the step of printing said elastomeric material layer by a stencil printing, a screen printing, a coating or a laminating technique.

9. A method for fabricating a wafer level package according to claim 1 further comprising the step of forming said I/O redistribution metal traces by a sputtering technique.

10. A method for fabricating a wafer level package according to claim 1 further comprising the step of forming said I/O redistribution metal traces by an electroplating technique.

11. A method for fabricating a wafer level package according to claim 1 further comprising the step of forming said I/O redistribution metal traces in Al, Cu, Al alloys or Cu alloys.

12. A method for fabricating a wafer level package according to claim 1 further comprising the steps of:
    depositing a metal layer of Al, Cu, Al alloys or Cu alloys,
    depositing a photoresist layer on top of said metal layer,
    patterning said photoresist layer for said I/O redistribution metal traces, and
    etching said I/O redistribution metal traces and electrically connecting said at least two bond pads with said plurality of isolated islands.

13. A method for fabricating a wafer level package according to claim 1, wherein said organic material layer is formed of a photosensitive material such that the layer can be patterned to expose the metal traces formed on top of said plurality of isolated islands.

14. A method for fabricating a wafer level package according to claim 1 further comprising the step of forming said UBM layer by a method selected from the group consisting of electroless plating, electroplating and sputtering.

15. A method for fabricating a wafer level package according to claim 1 further comprising the steps of:
    forming said UBM layer on top of said wafer,
    forming a photoresist layer on said UBM layer, and
    patterning said photoresist layer such that said UBM layer only covers said plurality of isolated islands.

16. A method for fabricating a wafer level package according to claim 1 further comprising the step of planting said plurality of solder balls by a technique selected from the group consisting of plating, printing and pick and place.

17. A wafer level package comprising:
    a pre-processed wafer having at least two bond pads on top,
    a passivation layer on top of said wafer exposing said at least two bond pads,
    a plurality of isolated islands formed of an elastomeric material on top of said passivation layer, at least two I/O redistribution metal traces each electrically connecting one of said at least two bond pads to one of said plurality of isolated islands, an organic material layer covers and electrically insulates said wafer except metal traces on top of said plurality of isolated islands, an UBM layer on top of said metal traces on said plurality of isolated islands, and a plurality of solder balls each on top of one of said plurality of isolated islands with said metal traces and said UBM layer therein between.

18. A wafer level package according to claim 17, wherein said passivation layer is formed of silicon oxide or silicon nitride.

19. A wafer level package according to claim 17, wherein said plurality of isolated islands is formed of an elastomeric material having a Young's modules of not higher than 10 MPa/cm$^2$.

20. A wafer level package according to claim 17, wherein said plurality of isolated islands is formed to a thickness of not more than 50 μm.

21. A wafer level package according to claim 17, wherein said I/O redistribution metal traces are formed of Al, Cu, Al alloys or Cu alloys.

22. A wafer level package according to claim 17, wherein said organic material layer is formed of a photosensitive material for patterning and forming in a photolithographic process.

* * * * *